United States Patent

[11] 3,618,561

[72] Inventors Robert J. Wallis
Syracuse;
Clinton O. Woodard, Jr., Clay, both of N.Y.

[21] Appl. No. 809,192
[22] Filed Mar. 21, 1969
[45] Patented Nov. 9, 1971
[73] Assignee General Electric Company

[54] TUNER ASSEMBLY FOR A TELEVISION RECEIVER
3 Claims, 7 Drawing Figs.

[52] U.S. Cl. .......... 116/124.1, 74/10.85, 325/464, 334/86
[51] Int. Cl. .......... H03j 1/02
[50] Field of Search .......... 116/124.1, 124.2, 124.3, 124.4, 133, 124; 74/10.85; 325/455, 459, 464, 465; 334/86, 50, 87, 51; 178/7.91

[56] References Cited

UNITED STATES PATENTS

| | | | |
|---|---|---|---|
| 2,932,019 | 4/1960 | Pifer et al. | 178/7.91 |
| 2,348,391 | 5/1944 | Kester | 116/124.1 |
| 3,022,674 | 2/1962 | Cross et al. | 74/10.85 |
| 3,058,075 | 10/1962 | Polley | 334/51 |
| 3,175,407 | 8/1965 | Reinwall, Jr. | 74/10.8 |

*Primary Examiner*—Louis J. Capozi
*Attorneys*—Francis H. Boos, Jr., Frank L. Neuhauser, Oscar B. Waddell, Joseph B. Forman and James E. Espe

ABSTRACT: An improvement in a channel tuner assembly for a television receiver of the type including a tuner having a rotary channel selector shaft interconnected by drive train means to a channel indicator member. The improvement comprises providing yieldable means, such as a spring or the like, adjacent the drive train means to normally urge driving engagement between the indicator member and the tuner shaft, but being yieldable to permit temporary disengagement of the indicator member from the tuner shaft and movement independently thereof. With this improved arrangement, the channel indicator member can be more easily calibrated with the tuner than has previously been possible.

INVENTORS:
ROBERT J. WALLIS,
CLINTON O. WOODARD, JR.
BY Harry B. Daniell, III
THEIR ATTORNEY.

TUNER ASSEMBLY FOR A TELEVISION RECEIVER

BACKGROUND OF THE INVENTION

This invention relates to television receivers, and more particularly, to an improved tuner assembly for a television receiver.

Conventional television receivers are frequently provided with channel selector means which include a tuner having a rotary channel selector shaft that is interconnected by drive train means to a channel indicator member. Often, the tuner, the drive train means, and the indicator member are preassembled on a base member or bracket to form a tuner assembly that is removably mounted within the receiver cabinet. Usually, the tuner is detachably mounted on the bracket by fastener means, such as screws or the like, with the tuner selector shaft arranged such that it has its one end aligned to project through an opening provided in the front of the receiver cabinet and its opposite end aligned to extend toward the rear of the cabinet. The indicator member generally comprises a geared disc that is journaled on the front portion of the bracket for rotation about an axis transverse to that of the tuner shaft axis and is arranged to have just a small portion of its indicia-bearing outer circumference aligned with another opening provided in the front of the receiver cabinet. In such conventional tuner assemblies, the drive train usually comprises a gear train including a drive gear mounted on the rear of the tuner shaft and a driven gear mounted on the rear end of a rigid idler shaft that has its opposite end rotatably journaled on the bracket and interconnected to the indicator member. With such conventional tuner assemblies, the drive gear and the driven gear are engaged or intermeshed with one another at the time of the initial assembly of the elements on to the bracket and will remain so engaged unless the gears are removed from their respective shafts or the tuner is unfastened from the bracket.

Thus, it has been impossible with these prior art preassembled tuner assemblies to calibrate or align the particular channel which is indicated on the outer circumference of the indicator member as viewed through the opening in the front of the receiver cabinet with the channel selected by the rotary tuner selector shaft without either removing one of the drive train gears from their respective shafts or unfastening and rearranging the tuner or indicator member relative to the assembly base bracket.

As will become evident as this description proceeds, the present invention provides an improved tuner assembly for a television receiver which greatly simplifies the attainment of calibration between the tuner channel selector shaft and the channel indicator member.

SUMMARY OF THE INVENTION

The present invention provides an improvement in a channel tuner assembly for a television receiver of the type including a tuner having a rotary channel selector shaft interconnected by drive-train means to a channel indicator member. The improvement comprises providing yieldable means adjacent the drive-train means to normally urge driving engagement between the indicator member and the tuner shaft, but being yieldable to permit temporary disengagement of the indicator member from the tuner shaft and movement independently thereof. With the improved arrangement of the present invention, the channel indicator member can be more easily calibrated with the tuner than has previously been possible with the tuner assemblies heretofore available.

BRIEF DESCRIPTION OF THE DRAWING

The present invention is illustrated in the accompanying drawing, wherein.

DESCRIPTION OF THE PREFERRED EMBODIMENT

Figure 1:
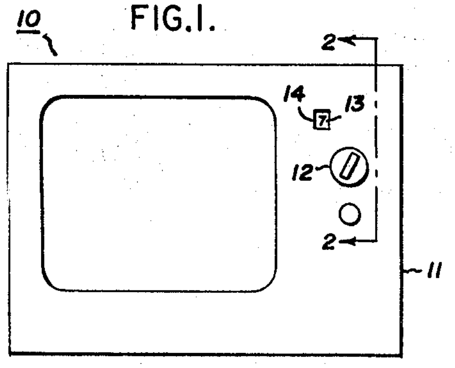
FIG. 1 is a front elevational view of the television receiver incorporating a presently preferred form of the present invention.

Referring now to the drawings and particularly to FIG. 1 thereof, there is illustrated a television receiver 10 having a generally rectangular boxlike outer cabinet 11. The receiver 10 is provided with means by which the viewer can select a particular station or channel he wishes to view. As shown in FIG. 1 the channel selector means is controlled by the viewer from the front wall of the receiver cabinet 11 and includes a rotary channel selector knob 12 and a channel indicator member 13 only a small portion of which is visible through an opening 14 provided in the front wall of the receiver cabinet 11. The knob 12 and the indicator member 13 are interconnected by means, which will hereinafter be described in detail, whereby manual rotation of the knob 12 by the viewer results both in selection of the desired channel and also in movement of the indicator member 13 relative to the cabinet opening 14 so as to centrally align the correct indicator indicium for the selected channel within the cabinet wall opening 14.

Figure 2:
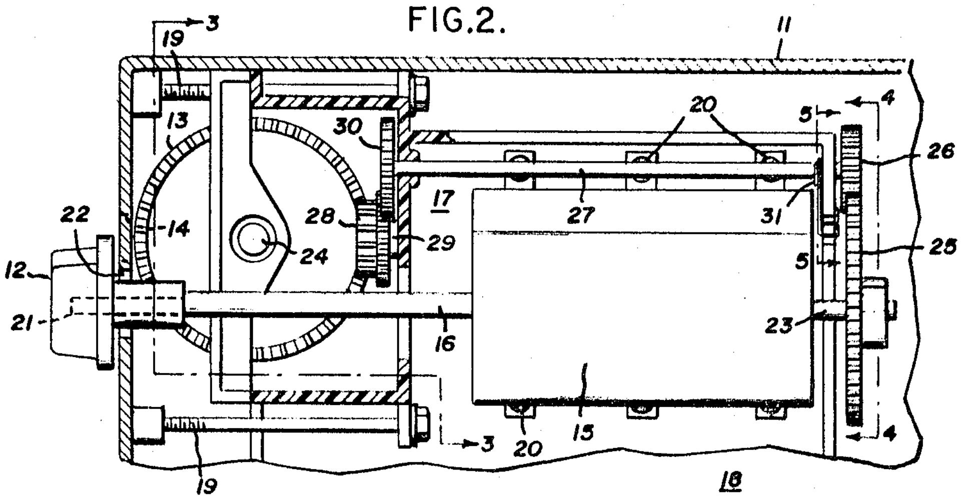
FIG. 2 is greatly enlarged fragmentary sectional view taken along line 2–2 of FIG. 1.

As best shown in FIG. 2, the channel selector means includes a conventional channel tuner 15 having a rotary channel selector shaft 16 that is interconnected by drive train means to the channel indicator member 13. The tuner 15, the drive train means, and the indicator member 13 are preassembled onto a base member or bracket 17 to form a tuner assembly 18 which is removably mounted within the cabinet 11 by fastener means, such as short screws 19. The tuner 15 is detachably mounted on the bracket 17 by fastener means, such as short screws 20, with the tuner selector shaft 16 arranged such that one of its ends 21 is aligned to project through another opening 22 provided in the front wall of the cabinet 11 and its opposite end 23 is aligned to extend toward the rear of the cabinet 11.

The indicator member 13, comprises a geared disc that is journaled on the front portion of the bracket 17 for rotation about an axis 24 transverse to the axis of the tuner selector shaft 16. The outer circumference of the indicator member or disc 13 is marked with a plurality of spaced indicia corresponding to the full range of channels capable of selection by the tuner 15, with the member 13 being so sized and aligned relative to the cabinet wall opening 14 that only one indicium can be centered within the opening 14.

Figure 3:
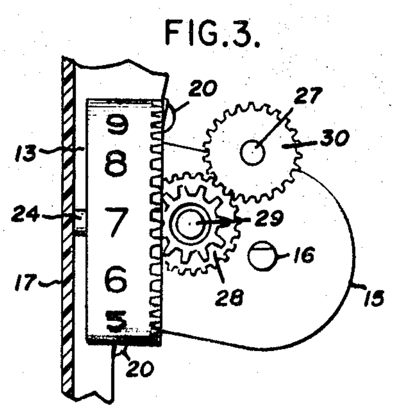
FIG. 3 is a fragmentary sectional view taken along line 3—3 of FIG. 2.

The drive train comprises a gear train including a drive member or gear 25 mounted on the rear end 23 of the tuner shaft 16 and a driven member or gear 26 mounted on the rear end of an idler shaft 27 that has its opposite or front end rotatably journaled on the bracket 17 and interconnected to the indicator member 13. As best shown in FIG. 3, the idler shaft 27 and the indicator member 13 are interconnected by an intermediate gear 28 that is rotatably journaled on an axle 29 which is provided on the frame 17 and generally parallels the axes of the tuner shaft 16 and the idler shaft 27. The teeth of the intermediate gear 28 are intermeshed with the gear teeth on the indicator member 13 and the teeth of yet another gear 30 which is mounted on the front end of the idler shaft 27.

As will be readily appreciated from an inspection of FIGS. 1-3, the elements comprising the tuner assembly 18 are first preassembled on the base member or bracket 17 and the tuner assembly 18 is then installed into the receiver cabinet 11 and fastened therein by means such as the long screws 19, with the front end 21 of the tuner shaft 16 projecting through the cabinet wall opening 22. Then, the selector knob 12 is affixed on the projecting front end 21 of the tuner shaft 16, whereby rotation of the tuner shaft 16 will directly result in selection of the various channels and will also cause, through the concurrent rotation of the drive gear 25, the driven gear 26, the idler shaft 27, and the gears 28 and 30, rotation of the indicator member 13 about its axis 24 and movement relative to the cabinet wall opening 14. Unfortunately, the channel selected by the tuner selector shaft 16 is not always in correct alignment or calibration with the channel that is indicated by the indicium on the portion of the outer circumference of the indicator member 13 which is rotated into the cabinet wall opening 14, and it is necessary to calibrate or realign the indicator member 13, with the selector shaft 16.

Heretofore, it has been impossible to calibrate or align a particular indicium on the outer circumference of the indicator member 13 with the opening 14 in the front of the cabinet 11 and with the particular channel selected by the rotary tuner shaft 16 without either removing one of the drive train gears from their respective shafts or axles or unfastening and rearranging the tuner 15 or indicator member 13 relative to the assembly base bracket 17.

Figure 4A:
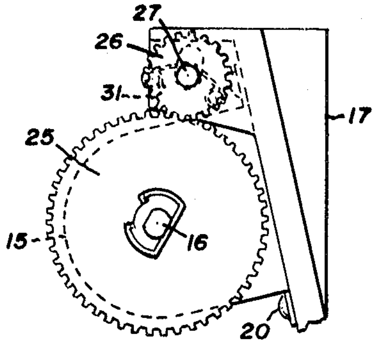
FIG. 4A and 4B are fragmentary views taken along line 4—4 of FIG. 2, with FIG. 4A showing the normal engaged condition of the drive train means and FIG. 4B showing the temporarily disengaged condition.
Figure 4B:
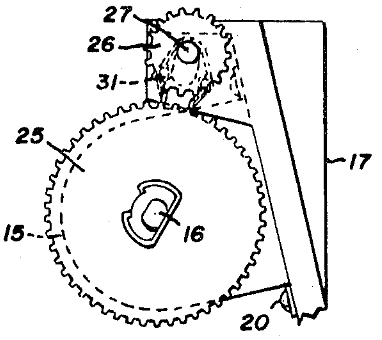
Figure 5A:
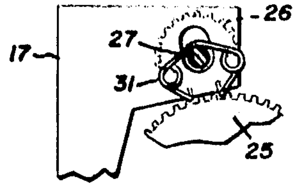
FIGS. 5A and 5B are fragmentary views taken along line 5—5 of FIG. 2, with FIG. 5A showing the yieldable means in the condition of FIG. 4A and FIG. 5B showing the yieldable means in the condition of FIG. 4B.
Figure 5B:
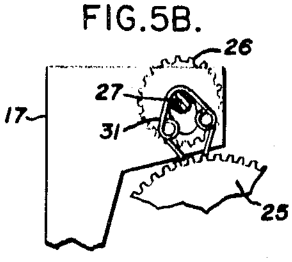

However, in accordance with the present invention it has been found that calibration or alignment between the tuner channel selector shaft 16 and the indicator member 13 can be greatly simplified by making the idler shaft 27 of a flexible material, such as acetal, nylon or the like, and, as shown in FIGS. 4A and 5A providing yieldable means, such as a spring 31 connected to the base bracket 17 and engaging the upper rear end of the idler shaft 27 to yieldably bias the idler shaft-mounted driven gear 26 downward into meshing engagement with the tuner shaft-mounted drive gear 25, but being yieldable, as shown in FIGS. 4B and 5B, under hand pressure, to permit upward movement of the idler shaft 27 and temporary disengagement of the driven gear 26 from the drive gear 25. Thus, idler shaft 27 can be manually rotated independently of the tuner shaft 16 to thus rotate the gears 28 and 30 (FIG. 3) to align or calibrate the particular indicium on the indicator member 13 appearing in the cabinet wall opening 14 with the particular channel selected by the tuner shaft 16.

As will be evident from the foregoing description, certain aspects of the present invention are not limited to the particular details of construction of the form illustrated, and it is contemplated that various other modifications or applications will occur to those skilled in the art. For example, the idler shaft 27 might be made of a rigid material, but be journaled on the base bracket 17 in movable bearing means, whereby the idler shaft-mounted driven gear 26 could be yieldably biased into engagement with the tuner shaft-mounted drive gear 25 by the spring 31. It is therefore, intended that the appended claims shall cover such modifications and applications as do not depart from the true spirit and scope of the present invention.

What is claimed is:

1. A channel tuner assembly for a television receiver comprising:
 - a tuner;
 - channel indicator means;
 - a rotary channel selector shaft directly connected to said tuner;
 - drive train means interconnecting said selector shaft to said indicator means;
 - said drive train means including at least one drive gear and one driven gear, said gears being normally engaged;
 - said drive train means further including resilient shaft means directly connected to one of said gears, said shaft means being adapted to deflect sufficiently to allow disengagement of said gears;
 - biasing means engaging said resilient shaft for normally maintaining said drive gear and said driven gear in driving engagement;
 - said biasing means being yieldable to permit temporary disengagement of said drive gear and said driven gear;
 - whereby said channel indicator means may be calibrated relative to said channel selector shaft and said tuner during said temporary disengagement.

2. The invention as defined in claim 1 wherein said biasing means comprises a spring.

3. The invention defined in claim 1 wherein said rotary channel selector shaft and said channel indicator means are mounted on a base member said driven gear being mounted on a first end of said shaft means, said shaft means having a second end thereof rotatably journaled on said base member and interconnected to said channel indicator means, said shaft means being sufficiently flexible to allow the first end thereof to be deflected to disengage said driven gear from said drive gear, said biasing means being connect to said base member and engaging said flexible shaft to yieldably bias said driven gear into driving engagement with said drive gear.

* * * * *